(12) United States Patent
Yun et al.

(10) Patent No.: US 8,574,971 B2
(45) Date of Patent: Nov. 5, 2013

(54) METHOD OF MANUFACTURING A THIN-FILM TRANSISTOR AND METHOD OF MANUFACTURING A DISPLAY SUBSTRATE USING THE SAME

(75) Inventors: Sang-Hyun Yun, Suwon-si (KR); Cha-Dong Kim, Cheonan-si (KR); Jung-In Park, Suwon-si (KR); Hi-Kuk Lee, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 251 days.

(21) Appl. No.: 12/900,936

(22) Filed: Oct. 8, 2010

(65) Prior Publication Data
US 2011/0230019 A1 Sep. 22, 2011

(30) Foreign Application Priority Data
Mar. 22, 2010 (KR) ........................ 10-2010-0025303

(51) Int. Cl.
*H01L 21/336* (2006.01)

(52) U.S. Cl.
USPC .... 438/158; 430/312; 430/313; 257/E21.028; 257/E21.038; 257/E21.235; 257/E21.414

(58) Field of Classification Search
USPC ................... 257/E21.028, E21.038, E21.235, 257/E21.414; 438/158; 430/312, 313
See application file for complete search history.

(56) References Cited

U.S. PATENT DOCUMENTS

| | | | | |
|---|---|---|---|---|
| 5,753,417 | A * | 5/1998 | Ulrich ........................... | 430/312 |
| 7,226,865 | B2 * | 6/2007 | Kido ............................. | 438/698 |
| 7,301,599 | B2 * | 11/2007 | Choi et al. .................... | 349/152 |
| 7,494,835 | B2 * | 2/2009 | Jee et al. ....................... | 438/30 |
| 7,859,756 | B2 * | 12/2010 | Ryzhikov et al. ............. | 359/619 |
| 2003/0008216 | A1 * | 1/2003 | Bula et al. ........................ | 430/5 |
| 2007/0252207 | A1 * | 11/2007 | Park et al. .................... | 257/347 |
| 2007/0264759 | A1 * | 11/2007 | Kamakura .................... | 438/141 |
| 2008/0113302 | A1 * | 5/2008 | Takashima et al. ........... | 430/322 |
| 2008/0224251 | A1 * | 9/2008 | Troost et al. ................. | 257/499 |
| 2008/0251877 | A1 * | 10/2008 | Jain et al. ..................... | 257/499 |
| 2009/0023098 | A1 * | 1/2009 | Jain et al. ..................... | 430/296 |
| 2009/0262319 | A1 * | 10/2009 | Matsuura et al. ............... | 355/53 |

* cited by examiner

*Primary Examiner* — George Fourson, III
(74) *Attorney, Agent, or Firm* — H.C. Park & Associates, PLC

(57) ABSTRACT

An approach for patterning and etching without a mask is provided in a manufacturing a thin-film transistor, a gate electrode, a gate insulating layer, a semiconductor layer, an ohmic contact layer and source metal layer of a substrate. A first photoresist pattern including a first photo pattern and a second photo pattern is formed using a digital exposure device by generating a plurality of spot beams, the first photo pattern is formed to a first region of the base substrate and has a first thickness, and the second photo pattern is formed to a second region adjacent to the first region, and has a second thickness and a width in a range of about 50% to about 60% of a diameter of the spot beam. The source metal layer is patterned to form a source electrode and a drain electrode, and the source electrode and the drain electrode are spaced apart from each other in the first region of an active pattern.

20 Claims, 11 Drawing Sheets

METHOD OF MANUFACTURING A THIN-FILM TRANSISTOR AND METHOD OF MANUFACTURING A DISPLAY SUBSTRATE USING THE SAME

CROSS-REFERENCE TO RELATED APPLICATION

This application claims priority to and benefit of Korean Patent Application No. 2010-25303, filed on Mar. 22, 2010, which is herein incorporated by reference for all purposes as if fully set forth herein.

BACKGROUND OF THE INVENTION

1. Field of the Invention

Exemplary embodiments of the present invention relate to a method for providing an optical lithography without using a conventional mask for manufacturing a thin-film transistor of a display substrate.

2. Description of the Related Art

Typically, a liquid crystal display (LCD) panel may include a display substrate, a substrate oppositely disposed and facing the display substrate, and a liquid crystal layer interposed between the display substrate and the substrate.

The display substrate may include gate and data lines crossing each other, a thin-film transistor (TFT) formed at intersections between the gate lines and the data lines and connected to the gate lines and the data lines, and a pixel electrode connected to the TFT.

A photo mask is used to form patterns on the substrate. For example, the display substrate may be manufactured using a set of photo masks each masks defining a pattern layer, for example, using a four-mask or a five-mask process.

The four-mask process in which patterns of a gate insulating layer, a semiconductor layer, an ohmic contact layer and a source layer are formed using a single mask, may be employed to form the display substrate so as to simplify the manufacturing process. In this case, a slit mask or a halftone mask may be used to form a channel of the TFT. However, the slit mask and the halftone mask are expensive so that the manufacturing cost of the LCD panel may inevitably be increased.

Furthermore, the slit mask providing a maximum resolution with about 3 μm is at odd with a technical challenge in manufacturing a slit pattern to define a uniform channel having such a very small width.

SUMMARY OF THE INVENTION

Exemplary embodiments of the present invention provide a method of manufacturing a thin-film transistor using a digital exposure device without using a mask.

Additional features of the invention will be set forth in the description which follows, and in part will be apparent from the description, or may be learned by practice of the invention.

Exemplary embodiments of the present invention provide a method. The method includes forming a gate electrode on a substrate. The method also includes disposing a gate insulating layer, a semiconductor layer, an ohmic contact layer and a source metal layer on the substrate. The method includes forming a first photoresist pattern including a first photo pattern and a second photo pattern using a digital exposure device generating a plurality of spot beams. The first photo pattern is formed to a first region of the substrate and has a first thickness, the second photo pattern is formed to a second region adjacent to the first region and has a second thickness and a width in a range of about 50% to about 60% of a diameter of a spot beam of the plurality of spot beams. The second thickness of the second pattern is smaller than the first thickness of the first pattern. The method includes patterning the source metal layer using the first photoresist pattern as an etching mask to form a source electrode and a drain electrode. The source electrode and the drain electrode are spaced apart from each other at the first region of an active pattern.

Exemplary embodiments of the present invention provide a method for providing maskless patterning. The method includes forming a gate pattern comprising a gate line and a gate electrode of a thin film transistor (TFT) on a substrate. The method also includes disposing a gate insulating layer, a semiconductor layer, an ohmic contact layer and source metal layer of the substrate. The method includes forming a first photoresist pattern including a first photo pattern and a second photo pattern using a digital exposure device generating a plurality of spot beams. The first photo pattern is formed to a first region of the substrate and has a first thickness, the second photo pattern is formed to a second region adjacent to the first region and has a second thickness and a width in a range of about 50% to about 60% of a diameter of a spot beam of the plurality of spot beams. The second thickness of the second pattern is smaller than the first thickness of the first pattern. The method further includes patterning the source metal layer by using the first photoresist pattern as an etching mask to form a source pattern the source pattern including a source electrode and a drain electrode. The source electrode and the drain electrode are spaced apart from each other at the first region of an active pattern. The method also includes forming a pixel electrode formed on the substrate having the source pattern and electrically being connected to the drain electrode.

Exemplary embodiments of the present invention provide an exposure method. The method includes patterning a photoresist to form a metal layer associated with a source electrode and drain electrode of a substrate by exposing overlapped light beams, the patterning includes a first pattern and a second pattern. The first pattern including a first thickness is exposed to a first region of the substrate and the second pattern including a thickness about 50% to 60% of a diameter of a light spot of the light beams. The second pattern is exposed adjacent to the first pattern, and the thickness of the second pattern is smaller than the first pattern, wherein a thin-film transistor (TFT) is formed by depositing thin films of a semiconductor active layer, a dielectric layer and a metallic contact over the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
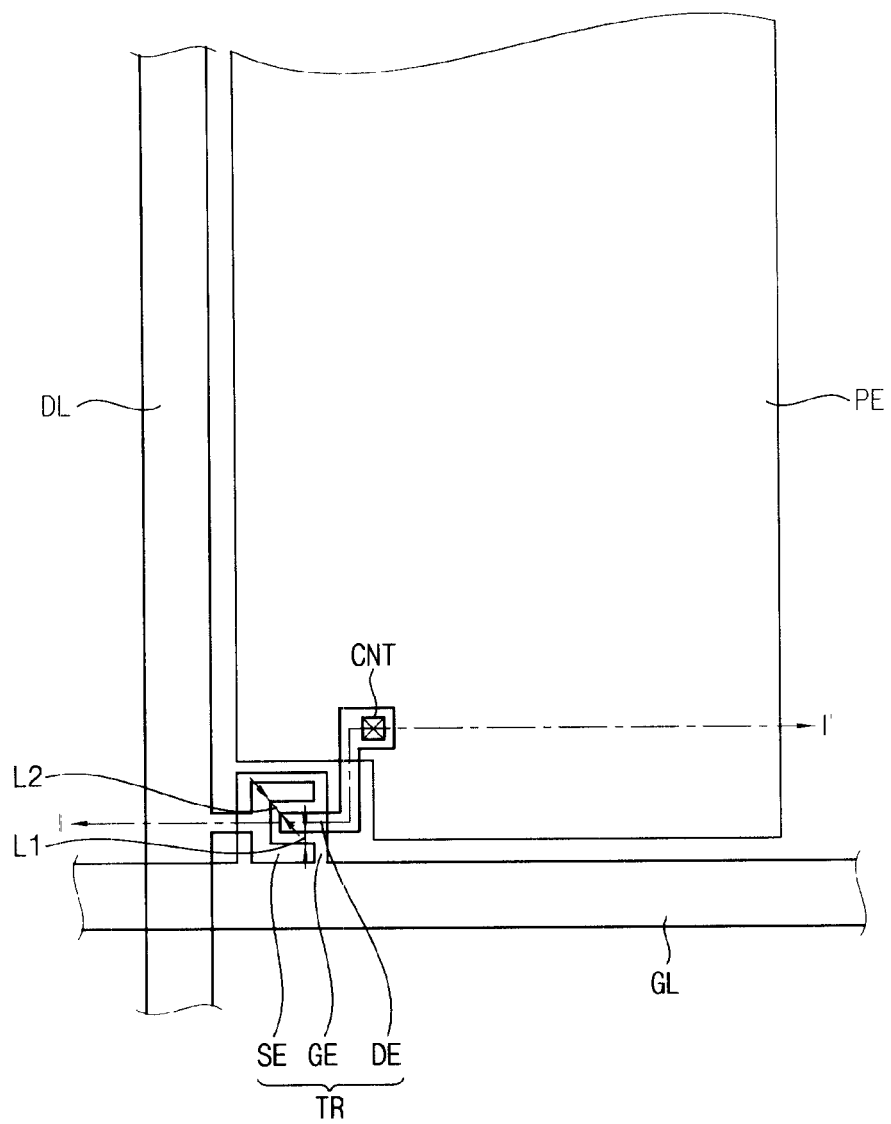
FIG. 1 is a plan view illustrating a display substrate according to exemplary embodiments of the present invention.

Advantages and features of the present invention can be understood more readily by reference to the following detailed description of exemplary embodiments and the accompanying drawings. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It is understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It is understood that although numerical terms such as first, second, and third may be used herein to describe various elements, components, regions, layers and/or sections, these elements, components, regions, layers and/or sections should not be limited by these numerical terms. These terms are merely used to specify a sequence order of an element, a component, a region, a layer or a section. Thus, a first element, a first component, a first region, a first layer or a first section discussed below may be interpreted a second element, a second component, a second region, a second layer or a second section without departing from the teachings of the present invention.

Spatially relative terms, such as "beneath," "below," "lower," "above," "upper" and the like, may be used herein for illustration of elements or spatial relationship with respect to one element or feature's relationship to another element(s) or feature(s) as illustrated in the figures. It is understood that the spatially relative terms may be intended to encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the exemplary term "below" may encompass both an orientation of above and below. The apparatus may be otherwise oriented (rotated 90 degrees or at other orientations) and the spatially relative terms used herein may be interpreted accordingly.

It is also understood that terminology used herein is for the purpose of describing particular example embodiments only and is not intended to be limiting of the present invention. As used herein, the singular forms "a," "an" and "the" may include the plural forms as well unless the context clearly indicates otherwise. It is further understood that the terms "comprises" and/or "comprising," when used in this specification, specify the presence of stated features, integers, steps, operations, elements, and/or components, but may not be interpreted to preclude an addition of one or more other features, integers, steps, operations, elements, components, and/or groups thereof.

Exemplary embodiments of the present invention are described herein with reference to cross-sectional illustrations that are schematic illustrations of idealized example embodiments (and intermediate structures) of the present invention. As such, variations from the shapes of the illustrations as a result, for example, for manufacturing techniques and/or tolerances, are to be expected. Thus, exemplary embodiments of the present invention should not be construed as limited to the particular shapes of regions illustrated herein but are to include deviations in shapes that result, for example, by way of manufacturing configurations. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are examples in nature and their shapes may not be intended to illustrate the actual shape of a region of a apparatus and may not be intended to limit the scope of the present invention.

Unless otherwise defined, all terms (including technical and scientific terms) used herein have the same meaning as commonly understood by one of ordinary skill in the art to which this invention belongs. It is further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention is explained in detail with reference to the accompanying drawings.

Figure 2:
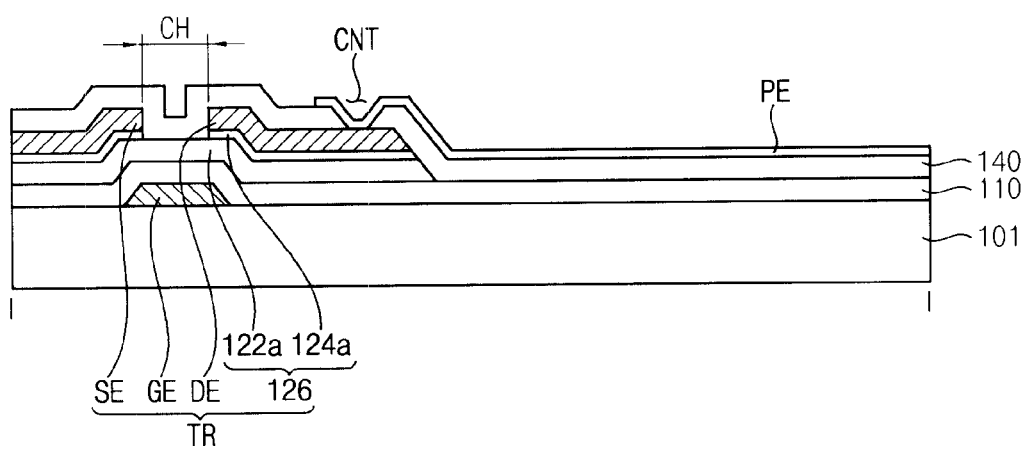
FIG. 2 is a cross-sectional view taken along a line I-I' of FIG. 1.

FIG. 1 is a plan view illustrating a display substrate according to exemplary embodiments of the present invention. FIG. 2 is a cross-sectional view taken along a line I-I' of FIG. 1.

Referring to FIG. 1 and FIG. 2, a display substrate includes a base substrate 101, a gate line GL, a data line DL, a gate insulating layer 110, a thin-film transistor (TFT) TR, a protection insulating layer 140 and a pixel electrode PE.

The gate line GL extends in a first direction D1. The data line DL extends in a second direction D2 crossing the first direction D1.

The gate insulating layer 110 covers the gate line GL and a gate electrode GE of the TFT TR.

The TFT TR is disposed adjacent to a region in which the gate line GL and the data line DL cross each other. The TFT TR includes the gate electrode GE, an active pattern 126, a source electrode SE and a drain electrode DE.

The gate electrode GE extends from the gate line GL.

The active pattern 126 overlaps with the gate electrode GE and has the gate insulating layer 110 disposed there between.

The active pattern 126 may include a semiconductor layer 122a including amorphous silicon and an ohmic contact layer 124a including amorphous silicon doped with n-type impurities at a high concentration.

Alternatively, the active pattern 126 may include a semiconductor layer including a metallic oxide. In this example, the ohmic contact layer 124a may be omitted in the active pattern 126. The metal oxide may include one of oxide of indium (In), tin (Sn), zinc (Zn) or any combination thereof. A different metal from indium (In), tin (Sn) and zinc (Zn) may be doped in the metal oxide. The source electrode SE makes contact with the ohmic contact layer 124a on the base substrate 101 having the semiconductor layer 122a formed on the base substrate 101.

The drain electrode DE is spaced apart from the source electrode SE on the base substrate 101 having the semiconductor layer 122a formed on the base substrate 201. A channel portion CH is defined by a separate region between the source electrode SE and the drain electrode DE. A length of the channel portion CH may be about 1.2 μm to about 1.3 μm.

The protection insulating layer 140 covers the source electrode SE and the drain electrode DE. The protection insulating layer 140 includes a contact hole CNT exposing the drain electrode DE.

The pixel electrode PE includes a transparent conductive material. The pixel electrode PE is electrically connected to the drain electrode DE of the TFT TR through the contact hole CNT formed through the protection insulating layer 140.

Figure 3:
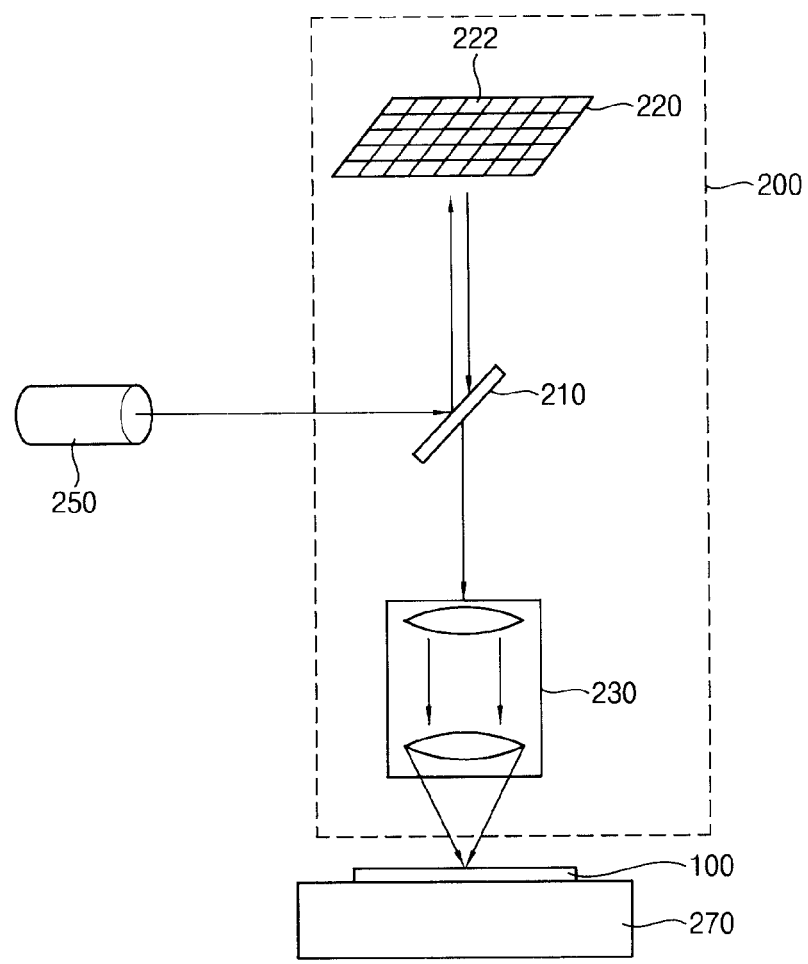
FIG. 3 is a diagram illustrating a digital exposure device used for manufacturing the display substrate of FIG. 2.
Figure 4:
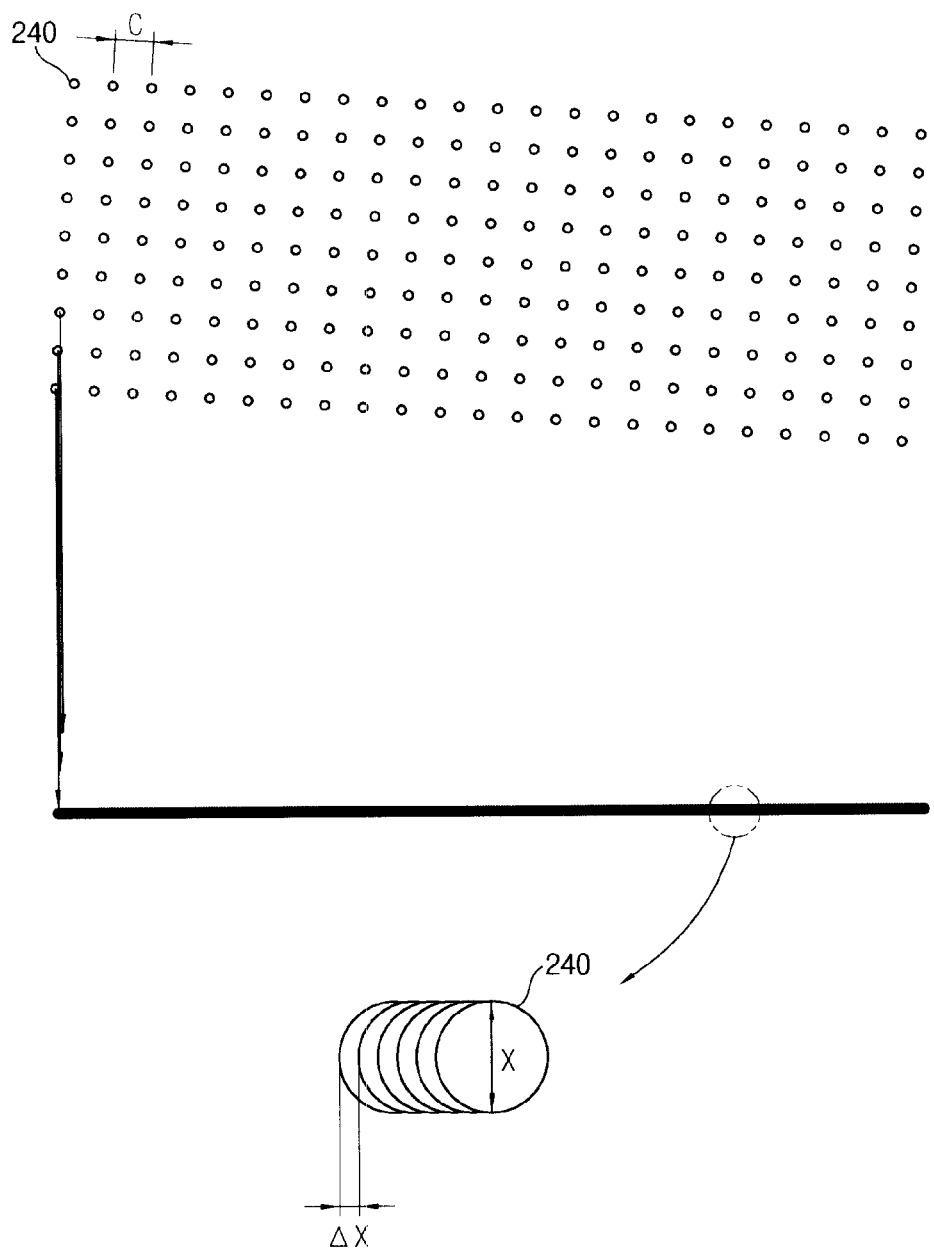
FIG. 4 is a diagram illustrating an exposure mechanism of the digital exposure device of FIG. 3.

FIG. 3 is a diagram illustrating a digital exposure device used for manufacturing of the display substrate of FIG. 2. FIG. 4 is a diagram illustrating an exposure mechanism of the digital exposure of FIG. 3.

Referring to FIG. 3 and FIG. 4, a digital exposure device includes an exposure head 200, a light source 250 and a stage 270.

The exposure head 200 may include a beam splitter 210, a digital micro-mirror device ("DMD") 220 and an optical system 230.

The beam splitter 210 reflects and transmits a laser beam incident from the light source 250. The laser beam reflected by the beam splitter 210 is provided to the DMD 220. The light source 250 provides the laser beam for an exposure.

The DMD 220 includes a plurality of micro-mirrors 222. For example, the DMD 220 may include 1204×768 micro-mirrors 222. The micro-mirrors 222 are arranged in an (m×n) matrix shape. A highly reflective material such as aluminum (Al) is deposited on a surface of the micro-mirrors 222. Each of the micro-mirrors 222 may be inclined at an angle of ±a° (for example, ±12°). The micro-mirrors 222 may selectively reflect the laser beam incident from the beam splitter 210 based on an exposure data so that the reflected laser beam may be transferred onto a substrate 100 which is disposed on the stage 270.

The exposure head 200 may further include a mirror control part (not shown) controlling each of the micro-mirrors 222 based on the exposure data. The mirror control part outputs a signal controlling an activation or inactivation (on/off) of the micro-mirrors 222 to each of the micro-mirrors 222. When the micro-mirrors 222 receive the activation data from the mirror control part, each of the micro-mirrors 222 may output a reflected beam onto the optical system 230.

The optical system 230 may include a plurality of lenses. The optical system 230 converts the reflect beam from the DMD 220 into a plurality of spot beams 240. The optical system 230 concentrates the reflected beam from DMD 220 and increases a distance between the beams.

The digital exposure device irradiates the spot beams 240 onto the substrate 100 passing through the exposure head 200 to expose a photoresist layer formed on the substrate 100. The substrate 100 is exposed by the spot beams 240 overlapping with each other. The DMD 220 is inclined at a predetermined angle 'θ' with respect to the substrate 100 to expose a continuous line or a continuous area in a direction substantially perpendicular to a scanning direction. As the stage 270 moves in the scanning direction, the substrate 100 may be exposed by the exposure head 200. For example, the predetermined angle 'θ' may be more than about 0 and less than about 1 degree. Preferably, the predetermined angle 'θ' may be about 0.1 to about 0.5 degrees. Thus, as shown in FIG. 4, the spot beams 240 outputted from the exposure head 200 have a predetermined inclination. A diameter x of each of the spot beams 240 may be about 2.0 μm to about 2.5 μm. A distance c between the spot beams 240 adjacent to each other is about 60 μm to about 80 μm. When the distance c between the adjacent spot beams 240 is less than about 60 μm or is more than about 80 μm, a resolution may be deteriorated or a tack time may be slowed down during an exposure. Thus, in order to improve the resolution and the tack time, the distance c between the adjacent spot beams 240 may be no less than about 60 μm and no more than about 80 μm.

In addition, a distance Δx between the adjacent spot beams 240 irradiated in an exposure area of the substrate 100 is about 100 nm to about 300 nm. When the distance Δx between the adjacent spot beams 240 is less than about 100 nm or is more than about 300 nm, the resolution may be deteriorated or the tack time may be slowed down during an exposure. Thus, in order to improve the resolution and the tack time, the distance Δx between the adjacent spot beams 240 may be no less than about 100 nm and no more than about 300 nm.

The diameter x of each of the spot beams 240, the distance c between the adjacent spot beams 240, an angle θ of the spot beam 240 irradiated to the substrate 100 and a scanning speed of the DMD 220 may be factors affecting a channel design of the TFT TR.

When the exposure head 200 irradiates light onto the substrate 100 without being inclined with respect to the stage 270, that is, the angle θ of the exposure head 200 is less than about 0.1°, the light may be not irradiated to areas of the substrate 100 corresponding to positions between the spot beams 240 adjacent to each other even though the exposure head 200 moves in a first direction. For example, a continuous line pattern or a continuous area may not be exposed. In addition, when the angle θ is more than about 0.5°, a distance between the spot beams 240 provided by the first row of micro-mirrors 222 and the spot beams 240 provided by the second row of micro-mirrors 222 is increased at a straight line area of the stage 270. For example, an overlapping area between the spot beams 240 provided by the first row of micro-mirrors 222 and the spot beams 240 provided by the second row of micro-mirrors 222 is decreased so that an amount of light provided to the straight line area is decreased. Thus, the amount of light provided to the substrate 100 is smaller than the amount of light required to the substrate 100. In addition, a pattern quality such as a line edge roughness (LER) may be deteriorated. Therefore, in order to provide the amount of light required to the entire substrate 100 using the exposure head 200, the angle θ may be no less than about 0.1° and no more than about 0.5°.

The exposure head 200 provides the spot beams 240 spaced apart from each other on the substrate 100. However, as mentioned above, since the exposure head 200 is inclined with respect to the stage 270 by the predetermined angle and the stage 270 moves, the substrate 100 corresponding to a scanned area by the exposure head 200 may be entirely exposed by the exposure head 200 without an unexposed area.

Hereinafter, a method of manufacturing the second display substrate of FIG. 2 using the digital exposure device is explained with reference to FIG. 5A, FIG. 5B, FIG. 5C, FIG. 5D, FIG. 5E and FIG. 5F.

FIG. 5A, FIG. 5B, FIG. 5C, FIG. 5D, FIG. 5E and FIG. 5F are cross-sectional views illustrating a method for manufacturing the display substrate of FIG. 2.

Figure 5A:
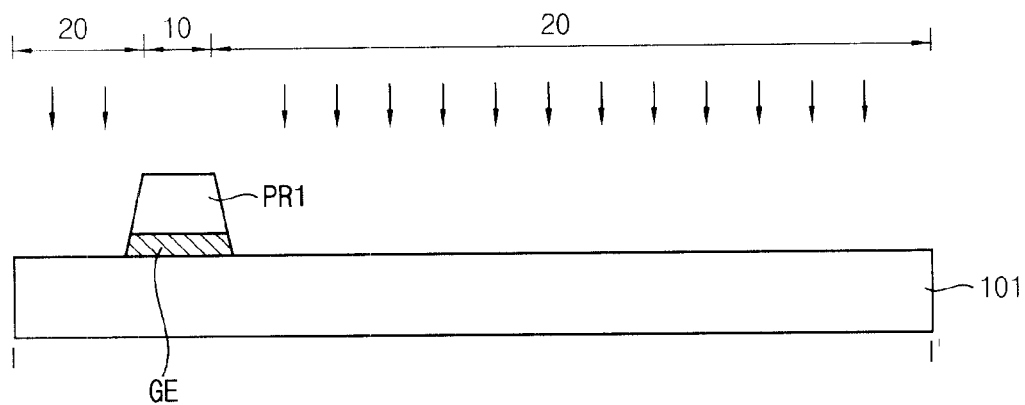
FIG. 5A, FIG. 5B, FIG. 5C, FIG. 5D, FIG. 5E and FIG. 5F are cross-sectional views illustrating a method for manufacturing the display substrate of FIG. 2.

Referring to FIG. 2 and FIG. 5A, a gate metal layer is formed on the base substrate 101. The gate metal layer may have a single layer structure or a double layer structure. For example, the gate metal layer may have a double layer structure including a first layer of titanium or alloys of titanium and a second layer of copper. A first photoresist pattern PR1 is formed on the base substrate 101 having the gate metal layer. The gate metal layer is patterned using the first photoresist pattern PR1 as an etching mask to form a gate pattern including a gate line GL and a gate electrode GE.

After forming a first photoresist layer including a light-sensitive material on the base substrate 101 having the gate metal layer, the spot beams from the digital exposure device are irradiated to a region 20 of the first photoresist layer excluding a region 10 where a gate electrode GE is formed, and then the first photoresist layer is developed to form the first photoresist pattern PR1. For example, the first photoresist layer may be a positive type photoresist so that a portion of the photoresist irradiated by the spot beams is removed by a developer and a portion of the photoresist not irradiated by the spot beams is cured to remain on the base substrate 101.

Figure 5B:
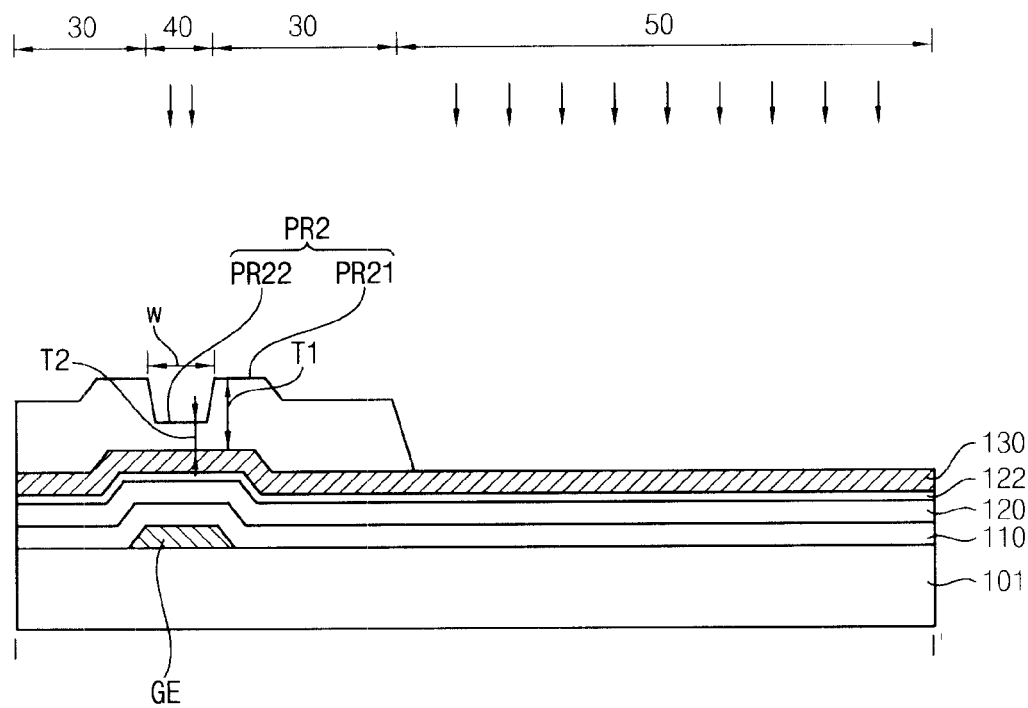

Referring to FIG. 5B, a gate insulating layer 110, a semiconductor layer 120, an ohmic contact layer 122 and a source metal layer 130 are sequentially formed on the base substrate 101 having the gate pattern formed on the base substrate 101. The source metal layer 130 may have a triple layer structure including molybdenum, aluminum and molybdenum. Alternatively, the source metal layer 130 may have a double layer structure including titanium and copper.

A second photoresist pattern PR2 is formed on the base substrate 101 having the source metal layer 130. The second photoresist pattern PR2 includes a first photo pattern PR21 and a second photo pattern PR22. The first photo pattern PR21 is formed in a first region 30 and has a first thickness T1. The second photo pattern PR22 is formed in a second region 40 and has a second thickness T2 and a width w in a range between about 50% and about 60% of a diameter of the spot beam. The second thickness T2 is smaller than the first thickness T1. The diameter of the spot beam is about 2.0 μm to about 2.5 μm. When the width w of the second photo pattern PR22 is less than about 50% of the diameter of the spot beam, the amount of an exposing light is insufficient so that the second photo pattern PR22 may be thicker than target thickness and uniformity of the second photo pattern PR22 may be decreased. Thus, reliability of a patterning process may be decreased. In addition, when the width w of the second photo pattern PR22 is more than about 60% of the diameter of the spot beam, the amount of the exposing light is excessive so that the second photo pattern PR22 may hardly be formed.

Alternatively, when the diameter of the spot beam is less than about 2.0 μm, a resolution may be improved during the exposure, however, the tack time may be slowed down so that a productivity of the display substrate may be decreased. In addition, the spot beam having a diameter more than about 2.5 μm is useless in forming the TFT of the display apparatus due to a low resolution.

After forming a second photoresist layer on the base substrate 101 having the source metal layer 130, the spot beams are irradiated to the second region 40 and the third region 50 of the base substrate 101 to form the first photo pattern PR21 and the second photo pattern PR22. At this time, in order to irradiate different amounts of exposure light to the second region 40 and the third region 50, the amount of the spot beams may be adjusted. For example, the amount of exposure light irradiated to the second region 40 is smaller than that to the third region 50. The spot beams may not be irradiated to the first region 30 where the source pattern is formed. Alternatively, the spot beams may be irradiated to the first region 30, but the amount of exposure light irradiated to the first region 30 is smaller than that to the second regions 40. The amount of the spot beams may be adjusted using active and inactive (on/off) data of the DMD of the digital exposure device. When the second photoresist layer is a positive type photoresist, the second photoresist layer corresponding to the first region 30 is not removed by a developer, and remains with having the first thickness T1 on the source metal layer 130. The first thickness T1 may be substantially the same as an initial thickness of the second photoresist layer. The second photoresist layer corresponding to the second region 40 is partially removed by a developer, and remains having the second thickness T2 on the source metal layer 130. The second photoresist layer corresponding to the third region 50 is entirely removed by a developer so that the source metal layer corresponding to the third region 50 is exposed. As a result, the second photoresist pattern PR2 including the first photo pattern PR21 having the first thickness T1 and the second photo pattern PR22 having the second thickness T2 is formed on the source metal layer 130.

Figure 5C:
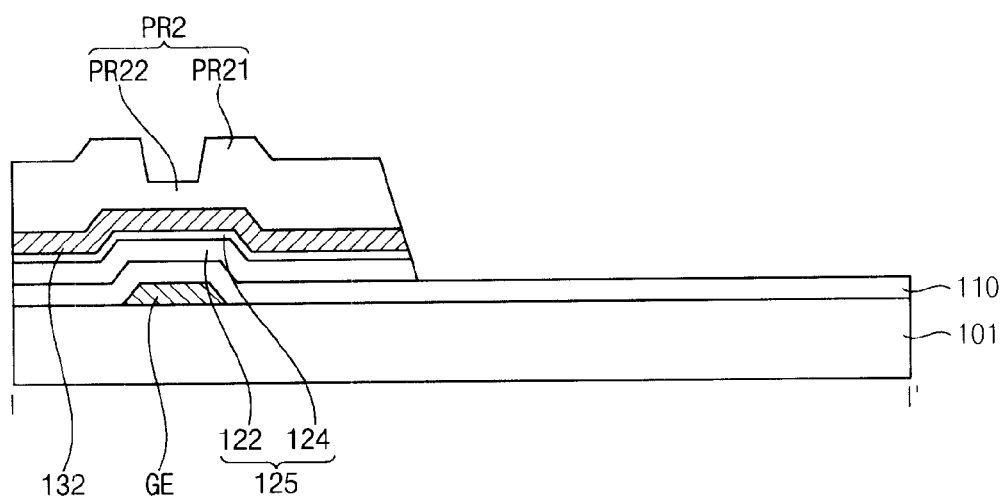

Referring to FIG. 5C, the source metal layer 130 is primarily etched using the second photoresist pattern PR2 as an etching protection layer. Hereinafter, a process via which the source metal layer 130 is primarily etched is defined as a first metal etching process. A source metal pattern 132 is formed on the base substrate 101 via the first metal etching process.

The ohmic contact layer 124 and the semiconductor layer 122 are etched using the source metal pattern 132 as an etching protection layer. Thus, a provisional active pattern 125 is formed under the source metal pattern 132. The provisional active pattern 125 includes the semiconductor pattern 122 and the ohmic contact pattern 124. The provisional active pattern 125 is formed under a data line (not shown) and the source metal pattern 132. The gate insulating 110 is exposed in a region except the source metal pattern 132.

Figure 5D:
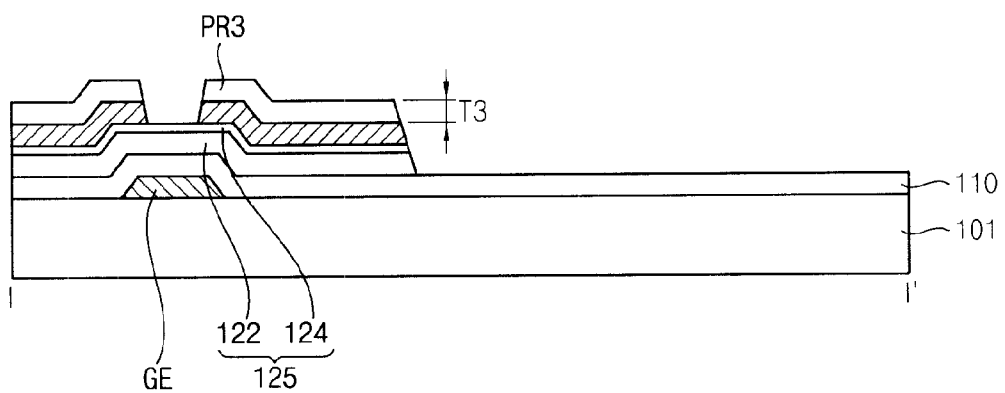

Referring to FIG. 5D, the second photo pattern PR22 of the second photoresist pattern PR2 is removed to form a remaining pattern PR3. For example, the second photoresist pattern PR2 is removed by the second thickness T2 so that the first photo pattern PR21 forms the remaining pattern PR3 having a third thickness T3. The third thickness T3 may be substantially the same as the difference between the second thickness T2 and the first thickness T1. The source metal pattern 132 is partially exposed through the second photo pattern PR22 as the second photo pattern PR22 is removed. The remaining pattern PR3 may be disposed in a region where the source electrode SE and the drain electrode DE are formed.

Figure 5E:
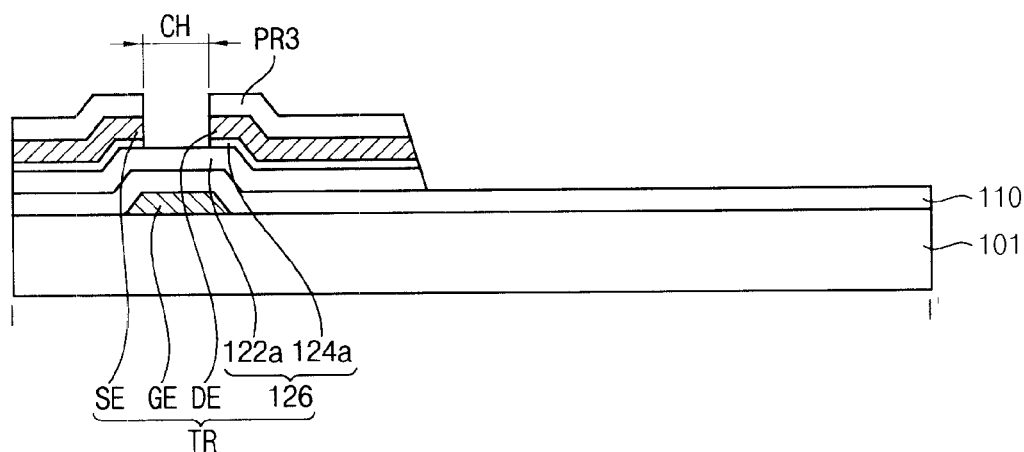

Referring to FIG. 5E, the source metal pattern 132 is secondarily etched using the remaining pattern PR3 as an etching protection layer. Hereinafter, a process in which the source metal pattern 132 is secondarily etched is defined as a second metal etching process. The source metal pattern on the second region 40 is removed via the second metal etching process. Accordingly, the source electrode SE and the drain electrode DE are formed.

Then, the ohmic contact pattern 122 on the second region 40 is partially removed using the source electrode SE and drain electrode DE and the remaining pattern PR3 as an etching protection layer to form a channel portion CH. A length of the channel portion CH may be larger than a width of the second photo pattern PR22 due to a skew generated during the etching process.

The remaining pattern PR3 may be removed using a stripper. Accordingly, the TFT TR including the gate electrode GE, the active pattern 126, the source electrode SE and the drain electrode DE is formed.

Figure 5F:
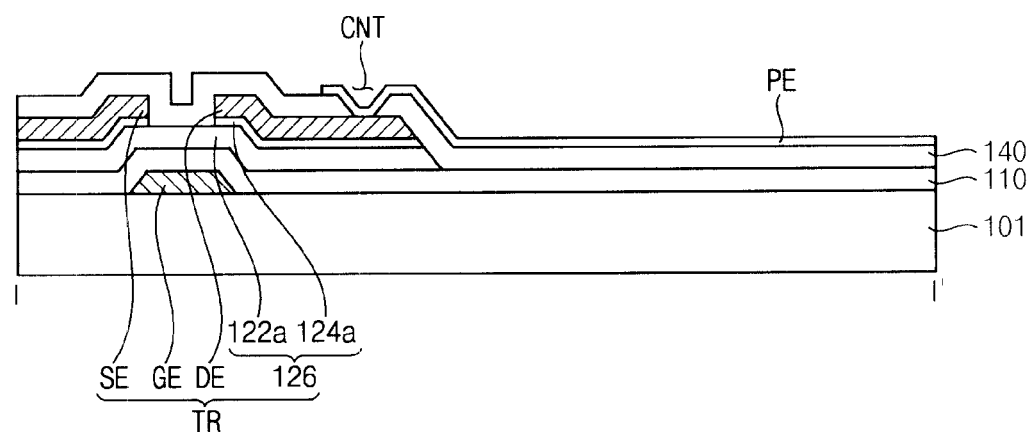

Referring to FIG. 5F, after forming the protection insulating layer 140 on the base substrate 101 having the TFT TR, the protection insulating layer 140 is patterned to form the contact hole CNT exposing the drain electrode DE.

The pixel electrode PE electrically connected to the drain electrode DE through the contact hole CNT is formed on the base substrate 101 having the protection insulating layer 140. Thus, the display substrate 100 according to exemplary embodiments of the present invention may be manufactured.

Hereinafter, experimental results show that a uniformity of a residual thickness of a photo pattern manufactured to form a source electrode, a drain electrode and a channel of the TFT that are explained.

Manufacturing Samples

Experimental results indicate that after the photoresist layer is formed on a glass substrate, CAD data having a channel design in Table 1 is converted into active or inactive data for controlling DMD. Then, the photoresist layer is exposed by the spot beams corresponding to the active or inactive data and is developed to manufacture Sample 1 SP1 and Sample 2 SP2, and Comparative Sample 1 CSP1, Comparative Sample 2 CSP2, Comparative Sample 3 CSP3, Comparative Sample 4 CSP 4, Comparative Sample 5 CSP5, Comparative Sample 6 CSP 6, Comparative Sample 7 CSP 7 and Comparative Sample 8 CSP 8 having a plurality of photo patterns. A diameter of each of the spot beams from the DMD may be about 2.2 µm.

In Table 1, "L1" indicates a length of a horizontal portion at a channel of a TFT TR as shown in FIG. 1, and "L2" indicates a length of a corner portion at the channel. Hereinafter, a channel length of the horizontal portion is denoted as "a first channel length L1," and a channel length of the corner portion is denoted as "a second channel length L2."

TABLE 1

| SP1 | | SP2 | |
|---|---|---|---|
| L1 | 1.25 µm | L1 | 1.25 µm |
| L2 | 1.06 µm | L2 | 1.23 µm |

| CSP1 | | CSP2 | | CSP3 | |
|---|---|---|---|---|---|
| L1 | 1.75 µm | L1 | 1.75 µm | L1 | 1.60 µm |
| L2 | 1.41 µm | L2 | 1.65 µm | L2 | 1.45 µm |

| CSP4 | | CSP5 | | CSP6 | |
|---|---|---|---|---|---|
| L1 | 1.60 µm | L1 | 1.40 µm | L1 | 1.40 µm |
| L2 | 1.56 µm | L2 | 1.24 µm | L2 | 1.38 µm |

| CSP7 | | CSP8 | |
|---|---|---|---|
| L1 | 1.00 µm | L1 | 0.90 µm |
| L2 | 0.99 µm | L2 | 0.90 µm |

Figure 6A:
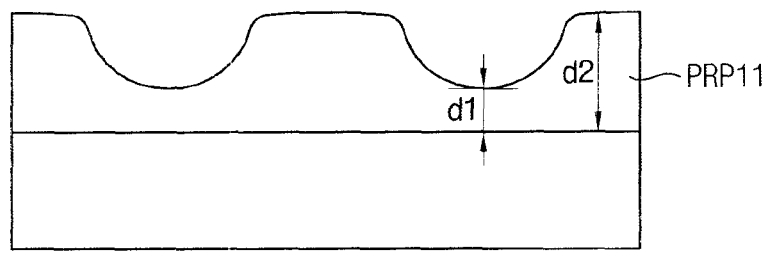
FIG. 6A and FIG. 6B are cross-sectional views illustrating photo patterns of samples manufactured according to exemplary embodiments of the present invention.
Figure 6B:
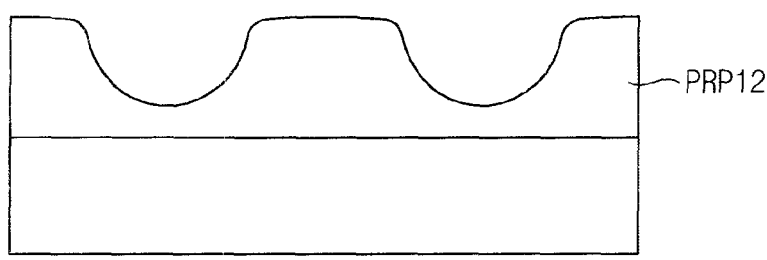

FIG. 6A and FIG. 6B are cross-sectional views illustrating photo patterns of Sample 1 and Sample 2 manufactured according to exemplary embodiments of the present invention, and FIG. 7A, FIG. 7B, FIG. 7C, FIG. 7D, FIG. 7E, FIG. 7F, FIG. 7G, and FIG. 7H are cross-sectional views illustrating photo patterns of Comparative Sample 1, Comparative Sample 2, Comparative Sample 3, Comparative Sample 4, Comparative Sample 5, Comparative Sample 6, Comparative Sample 7 and Comparative Sample 8.

At photo patterns shown in FIG. 6A, FIG. 6B and FIG. 7A, FIG. 7B, FIG. 7C, FIG. 7D, FIG. 7E, FIG. 7F, FIG. 7G and FIG. 7H, a portion having a first thickness is denoted as "a first thickness portion" and a portion having a second thickness thicker than the first thickness is denoted as "a second thickness portion."

Referring to FIG. 6A and FIG. 6B, it may be noted that a photo pattern PRP11 of Sample 1 SP1 includes a first thickness portion d1 having a first normal thickness and a second thickness portion d2 having a second normal thickness, and the first thickness portion d1 and the second thickness portion d2 are uniformly formed. In addition, it may be noted that first thickness portion and second thickness portion of a photo pattern PRP12 of Sample 2 SP2 are uniformly formed. As shown in Table 1, the first channel length L1 of Sample 1 SP1 and Sample 2 SP2 are about 1.25 µm which is about 56% of the diameter of the spot beam.

Figure 7A:
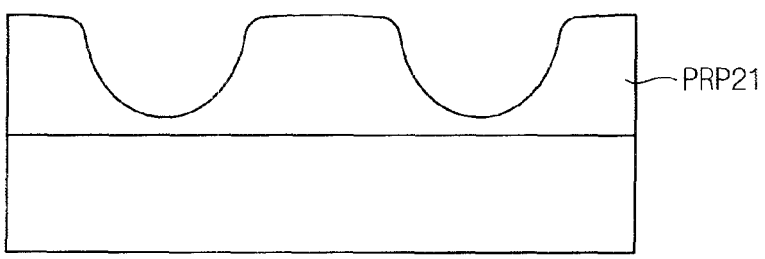
FIG. 7A, FIG. 7B, FIG. 7C, FIG. 7D, FIG. 7E, FIG. 7F, FIG. 7G and FIG. 7H are cross-sectional views illustrating photo patterns of samples.
Figure 7B:
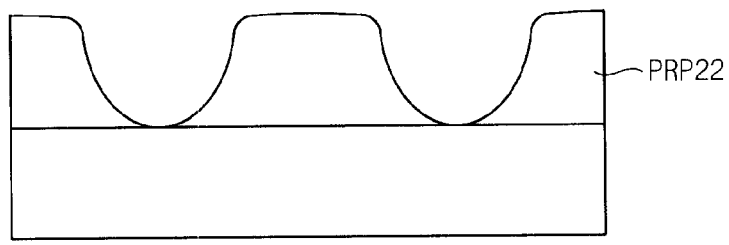

Referring to FIG. 7A and FIG. 7B, it may be noted that a second thickness portion of a photo pattern PRP21 of Comparative Sample 1 CSP1 had a substantially the same thickness as the second normal thickness, but a first thickness portion of the photo pattern PRP 21 is smaller than the first normal thickness. In addition, it may be noted that a second thickness portion of a photo pattern PRP22 of Comparative Sample 2 CSP2 had a substantially the same thickness as the second normal thickness, but a first thickness portion of the photo pattern PRP 22 is hardly formed. Thus, a glass substrate corresponding to the first thickness portion is exposed by the first thickness portion. The first channel length L1 of Comparative Sample 1 CSP 1 and Sample 2 CSP2 is about 1.75 µm which is longer than the first channel length L1 of Sample 1 SP 1 and Sample 2 SP2. The first channel length L1 of Comparative Sample 1 CSP1 and Sample 2 CSP2 is about 80% of the diameter of the spot beam. When the first channel length L1 of Comparative Sample 1 CSP1 and Sample 2 CSP2 is about 80% of the diameter of the spot beam, it may be noted that the first thickness portion received a large amount of the spot beams so that the first thickness portion is hardly formed.

Figure 7C:
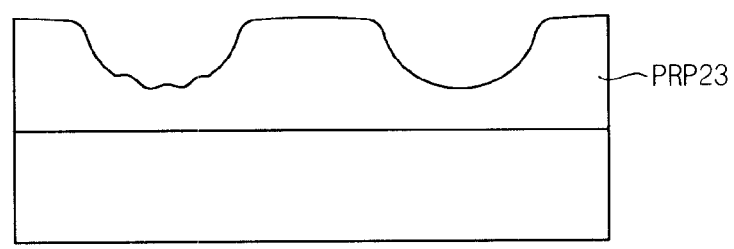
Figure 7D:

Referring to FIG. 7C and FIG. 7D, it may be noted that first thickness portions of photo patterns PRP23 and PRP24 of Comparative Sample 3 and Sample 4 are thicker than the first thickness portions of Comparative Sample 1 and Sample 2, but are not uniformly formed. The first channel length L1 of Comparative Sample 3 CSP3 and Sample 4 CSP4 is about 1.50 µm which is smaller than the first channel length L1 of Comparative Sample 1 CSP1 and Sample 2 CSP2 and larger than the first channel length L1 of Sample 1 SP1 and Sample 2 SP2. Thus, when first channel length L1 of Comparative Sample 3 CSP3 and Sample 4 CSP4 is more than about 60% of the diameter of the spot beam, it may be noted that the first thickness portions of Comparative Sample 3 CSP3 and Sample 4 CSP4 are not uniformly formed.

Figure 7E:
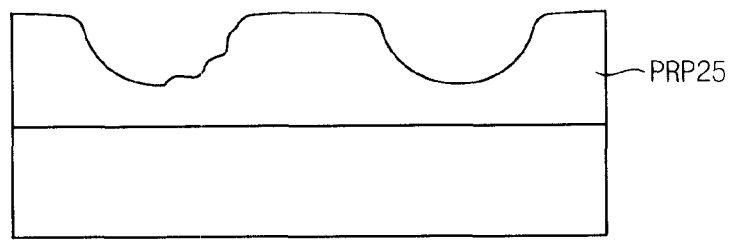
Figure 7F:
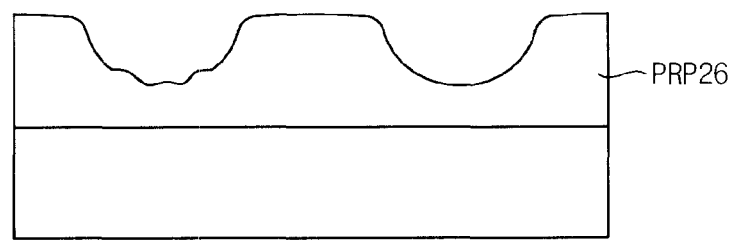

Referring to FIG. 7E and FIG. 7F, it may be noted that first thickness portions of photo patterns PRP25 and PRP26 of Comparative Sample 5 and Sample 6 are not formed uniformly. The first channel length L1 of Comparative Sample 5 CSP 5 and Sample 6 CSP6 is about 1.40 µm which is smaller than the first channel length L1 of Comparative Sample 3 CSP 3 and Sample 4 CSP4 and larger than the first channel length L1 of Sample 1 SP1 and Sample 2 SP2.

Figure 7G:
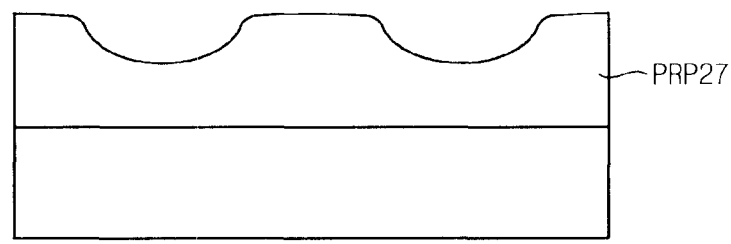
Figure 7H:
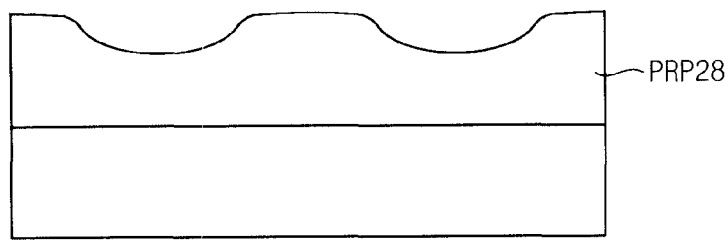

Referring to FIG. 7G and FIG. 7H, it may be noted that first thickness portions of photo patterns PRP27 and PRP28 of Comparative Sample 7 and Sample 8 are thicker than the first normal thickness. The first channel length L1 of the photo patterns PRP27 and PRP28 of Comparative Sample 7 CSP7 and Sample 8 CSP8 are no more than about 1.0 μm. Thus, when the first channel length L1 is very short, the spot beams are irradiated in a channel region so that it may be noted the first thickness portion of the photo patterns PRP27 and PRP28 are thicker than the first normal thickness.

Evaluation of a Uniformity of a Residual Thickness of a Photo Pattern

Figure 8:
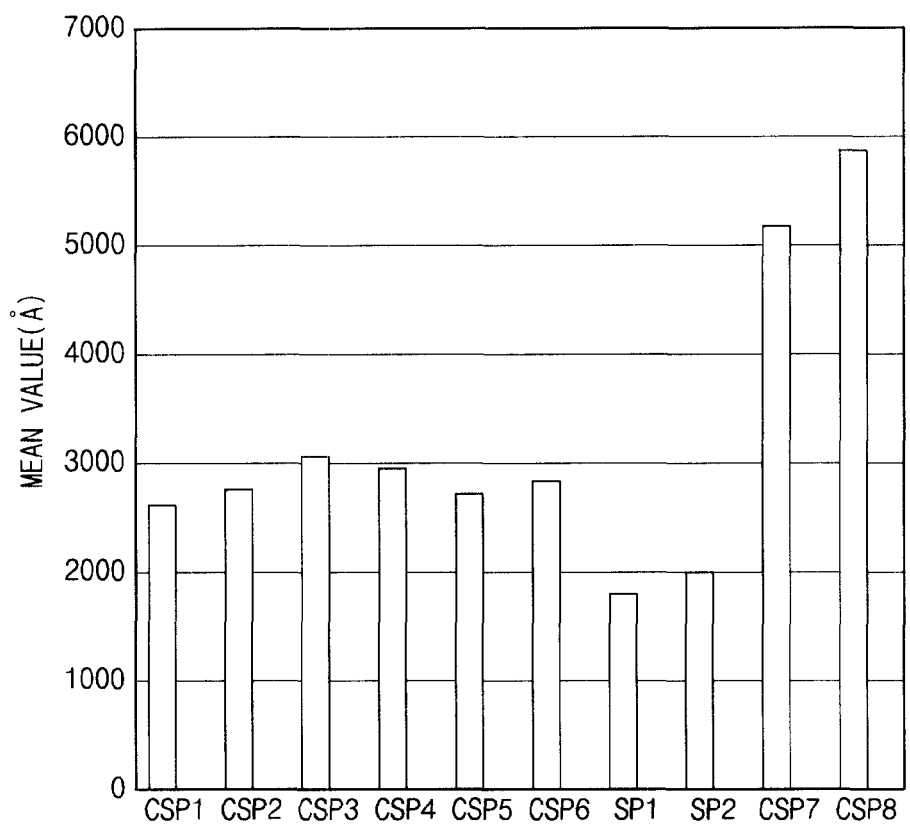
FIG. 8 is a graph showing a uniformity of a residual thickness of the photo patterns of the respective samples of FIG. 6A and FIG. 6B and samples of FIG. 7A, FIG. 7B, FIG. 7C, FIG. 7D, FIG. 7E, FIG. 7F, FIG. 7G and FIG. 7H.

Referring to FIG. 8, a thickness range of each of the regions selected in Sample 1 SP1 was calculated, and a mean value of Sample 1 SP1 was calculated using the each of the thickness ranges. In this example, the thickness ranges were the differences between the maximum and the minimum of the measured thickness at a plurality of points selected in each of the regions. As mentioned above, the mean values in each of Sample 2 and Comparative Sample 1, Comparative Sample 2, Comparative Sample, 3, Comparative Sample 4, Comparative Sample 5, Comparative Sample 6, Comparative Sample 7 and Comparative Sample 8 are calculated and the results are illustrated in FIG. 8.

FIG. 8 is a graph showing a uniformity of a residual thickness of the photo patterns of Sample 1 and Sample 2 manufactured according to exemplary embodiments of the present invention and Comparative Sample 1, Comparative Sample 2, Comparative Sample 3, Comparative Sample 4, Comparative Sample 5, Comparative Sample 6, Comparative Sample 7 and Comparative Sample 8.

In FIG. 8, an x-axis indicates Samples which were divided based on a channel length of the TFT, and a y-axis indicates the mean value with respect to each of the Samples. In this example, the larger the mean value is, the lower the residual thickness of the photo patterns is made, and the smaller the mean value is, the higher the residual thickness of the photo patterns is made.

Referring to FIG. 8, it may be noted that the mean value of Sample 1 SP1 manufactured in accordance with exemplary embodiments of the present invention is about 1865 Å and the mean value of Sample 2 SP2 is about 2013 Å. It may be noted the mean values of Comparative Sample 1 CSP1, Sample 2 CSP 2, Sample 3 CSP 3, Sample 4 CSP 4, Sample 5 CSP 5 and Sample 6 CSP6 are not less than about 2600 Å, and larger than the mean values of Samples 1 SP1 and Sample 2 SP2. In addition, it may be noted the mean values of Comparative Sample 7 CSP 7 and Comparative Sample 8 CSP8 are not less than about 4900 Å, and larger than the mean values of Comparative Sample 1 CSP 1, Comparative Sample 2 CSP 2, Comparative Sample 3 CSP 3, Comparative Sample 4 CSP 4, Comparative Sample 5 CSP 5 and Comparative Sample 6 CSP6.

For example, it may be noted that Sample 1 SP1 and Sample 2 SP2 are the best in the uniformity of the residual thickness. Referring to Table 1, the first channel lengths L1 of Sample 1 SP 1 and Sample 2 SP2 are substantially the same with each other, but the second channel length L2 of Sample 1 SP1 is different from that of Sample 2 SP2. For example, the second channel length L2 of Sample 1 SP1 is about 1.06 μm and the second channel length L2 of Sample 2 SP2 is about 1.23 μm. The second channel length L2 of Sample 1 SP1 is shorter than that of Sample 2 SP2. It may be noted that the uniformity of the residual thickness of the photo pattern of Sample 1 SP1 is better than that of Sample 2 SP2.

According to exemplary embodiments of the present invention, a channel of the TFT may be formed using a digital exposure device so that an expensive slit mask or halftone mask is unnecessary in an exposure process. Thus, a manufacturing cost of the TFT and the display substrate having the TFT may be decreased. In addition, the TFT having a uniform channel of no more than about 2 μm may be manufactured and thus a productivity of the TFT and the display substrate may be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method, comprising:
   forming a gate electrode on a substrate;
   disposing a gate insulating layer, a semiconductor layer, an ohmic contact layer and a source metal layer on the substrate;
   forming a first photoresist pattern comprising a first photo pattern and a second photo pattern using a digital exposure device generating a plurality of spot beams, the first photo pattern being formed in a first region of the substrate and having a first thickness, the second photo pattern being formed in a second region adjacent to the first region and having a second thickness and a width in a range of about 50% to about 60% of the respective diameters of the plurality of spot beams, the second thickness being smaller than the first thickness of the first pattern, wherein the plurality of the spot beams are irradiated overlapping with each other and in the first region and the second region; and
   patterning the source metal layer using the first photoresist pattern as an etching mask to form a source electrode and a drain electrode, the source electrode and the drain electrode being spaced apart from each other based on the second region, wherein the first region comprises an active pattern.

2. The method of claim 1, wherein the diameter of the spot beam is about 2.0 μm to about 2.5 μm.

3. The method of claim 2, wherein a distance between adjacent spot beams is about 60 μm to about 80 μm.

4. The method of claim 1, wherein a distance between the source electrode and the drain electrode is about 1.2 μm to about 1.3 μm.

5. The method of claim 1, wherein forming the first photoresist pattern comprises:
   forming a photoresist layer on the base substrate having the source metal layer;
   exposing the first region, the second region and a remaining region of the substrate with different amounts of exposure light beams using the digital exposure device; and
   developing the exposed regions of the photoresist layer to form the first photo pattern and the second photo pattern.

6. The method of claim 5, wherein the distance between the adjacent irradiated spot beams is about 100 nm to about 300 nm.

7. The method of claim 5, wherein the amount of exposure light beams onto the first region is larger than that onto the second region, and the amount of exposure light beams onto the remaining region is larger than that onto the second region.

8. The method of claim 1, wherein patterning the source metal layer to form the source electrode and the drain electrode comprises:
   patterning the source metal layer, the ohmic contact layer and the semiconductor layer using the first photoresist pattern as an etching mask to form a source pattern comprising the source electrode, the drain electrode and the active pattern;

removing the second photo pattern in the second region;

removing the source metal layer exposed in the second region to form the source electrode and the drain electrode; and removing the ohmic contact layer exposed in the second region using the source electrode and the drain electrode as an etching mask.

9. The method of claim 1, wherein forming the gate electrode comprises:

exposing a third region and a fourth region with different amounts of exposure light beams to form a second photoresist pattern in the third region of a gate metal layer; and patterning the gate metal layer using the second photoresist pattern as an etching mask to form the gate electrode in the third region.

10. A method for providing maskless patterning, the method comprising:

forming a gate pattern comprising a gate line and a gate electrode of a thin film transistor (TFT) on a substrate;

disposing a gate insulating layer, a semiconductor layer, an ohmic contact layer and source metal layer of the substrate;

forming a first photoresist pattern comprising a first photo pattern and a second photo pattern using a digital exposure device generating a plurality of spot beams, the first photo pattern being formed to a first region of the substrate and having a first thickness, the second photo pattern being formed to a second region adjacent to the first region and having a second thickness and a width in a range of about 50% to about 60% of the respective diameters of the plurality of spot beams, the second thickness of the second pattern being smaller than the first thickness of the first pattern, wherein the plurality of the spot beams are irradiated overlapping with each other and in the first region and the second region;

patterning the source metal layer using the first photoresist pattern as an etching mask to form a source pattern comprising a source electrode and a drain electrode, the source electrode and the drain electrode being spaced apart from each other based on the second region, wherein the first region comprises an active pattern; and forming a pixel electrode formed on the substrate having the source pattern and electrically being connected to the drain electrode.

11. The method of claim 10, wherein the diameter of the spot beam is about 2.0 μm to about 2.5 μm.

12. The method of claim 11, wherein a distance between adjacent spot beams is about 60 μm to about 80 μm.

13. The method of claim 10, wherein a distance between the source electrode and the drain electrode is about 1.2 μm to about 1.3 μm.

14. The method of claim 10, wherein forming the first photoresist pattern comprises:

forming a photoresist layer on the base substrate having the source metal layer;

exposing the first region, the second region and a remaining region of the base substrate with different amounts of exposure light beams using the digital exposure device; and developing the exposed regions of the photoresist layer to form the first photo pattern and the second photo pattern.

15. The method of claim 14, wherein the distance between the adjacent irradiated spot beams is about 100 nm to about 300 nm.

16. The method of claim 14, wherein the amount of exposure light beams onto the first region is larger than that onto the second region, and the amount of exposure light beams onto the remaining region is larger than that onto the second region.

17. The method of claim 10, wherein patterning the source metal layer to form the source electrode and the drain electrode comprises:

patterning the source metal layer, the ohmic contact layer and the semiconductor layer using the first photoresist pattern as an etching mask to form a source pattern comprising the source electrode, the drain electrode and the active pattern;

removing the second photo pattern in the second region;

removing the source metal layer exposed in the second region to form the source electrode and the drain electrode; and removing the ohmic contact layer exposed in the second region using the source electrode and the drain electrode as an etching mask.

18. The method of claim 10, wherein forming the gate electrode comprises:

exposing a third region and a fourth region with different amounts of exposure light beams to form a second photoresist pattern in the third region of a gate metal layer; and patterning the gate metal layer using the second photoresist pattern as an etching mask to form the gate electrode in the third region.

19. An exposure method, comprising:

patterning a photoresist to form a metal layer associated with a source electrode and drain electrode of a substrate by exposing overlapped light beams, the patterning comprises a first pattern and a second pattern, the first pattern comprising a first thickness being exposed to a region of the substrate and the second pattern comprising a thickness about 50% to about 60% of a diameter of a light spot of the respective light beams, the second pattern being exposed adjacent to the first pattern, and the thickness of the second pattern being smaller than the first pattern, wherein a thin-film transistor (TFT) is formed by depositing thin films of a semiconductor active layer, a dielectric layer and a metallic contact over the substrate.

20. The method of claim 1, wherein the second photo pattern being formed in the second region adjacent to the first region and having the second thickness and a width in the range of about 50% to about 60% of the respective diameters of the plurality of spot beams, when the plurality of the spot beams having diameters about 2.0 μm to about 2.5 μm are irradiated by overlapping with each other and in the first region and the second region.

* * * * *